United States Patent [19]

Shizukuishi et al.

[11] Patent Number: 4,866,002
[45] Date of Patent: Sep. 12, 1989

[54] COMPLEMENTARY INSULATED-GATE FIELD EFFECT TRANSISTOR INTEGRATED CIRCUIT AND MANUFACTURING METHOD THEREOF

[75] Inventors: Makoto Shizukuishi; Hideki Mutoh; Ryuji Kondo, all of Kaisei, Japan

[73] Assignee: Fuji Photo Film Co., Ltd., Kanagawa, Japan

[21] Appl. No.: 171,278

[22] Filed: Mar. 21, 1988

Related U.S. Application Data

[62] Division of Ser. No. 930,736, Nov. 14, 1986, abandoned.

[30] Foreign Application Priority Data

Nov. 26, 1985 [JP] Japan .................. 60-263906
Dec. 2, 1985 [JP] Japan .................. 60-269496

[51] Int. Cl.$^4$ .............. H01L 21/225; H01L 21/265; H01L 27/04; H01L 29/78
[52] U.S. Cl. .......................... 437/34; 437/46; 437/57; 437/152; 437/162; 357/42
[58] Field of Search .............. 437/57, 34, 46, 50, 437/152, 162, 933, 934

[56] References Cited

U.S. PATENT DOCUMENTS

| | | | |
|---|---|---|---|
| 3,865,654 | 2/1975 | Chang et al. | 357/42 |
| 4,104,784 | 8/1978 | Klein | 437/34 |
| 4,295,266 | 10/1981 | Hsu | 437/34 |
| 4,314,857 | 2/1982 | Aitken | 437/34 |
| 4,435,895 | 3/1984 | Parrillo | 437/34 |
| 4,450,620 | 5/1984 | Fuls et al. | 437/34 |
| 4,480,375 | 11/1984 | Cottrell et al. | 437/57 |
| 4,507,847 | 4/1985 | Sullivan | 437/34 |
| 4,517,731 | 5/1985 | Khan et al. | 437/34 |
| 4,525,920 | 7/1985 | Jacobs et al. | 437/57 |
| 4,558,508 | 12/1985 | Kinney et al. | 437/34 |
| 4,574,467 | 3/1986 | Halfacre et al. | 437/34 |
| 4,613,885 | 9/1986 | Haken | 357/42 |
| 4,717,683 | 1/1988 | Parrillo et al. | 437/34 |
| 4,717,686 | 1/1988 | Jacobs | 437/56 |

FOREIGN PATENT DOCUMENTS 59-182555 10/1984 Japan .................. 357/42

Primary Examiner—Olik Chaudhuri
Attorney, Agent, or Firm—Birch, Stewart, Kolasch & Birch

[57] ABSTRACT

In a complementary insulated-gate field effect transistor including insulated-gate field effect transistors of p-channel and n-channel types, a portion of the insulating material layer to be used to form the n-channel transistor is formed to be thicker than a portion thereof to be used to form the p-channel transistor, and a portion of the electrode material layer to be used to constitute the p-channel transistor is formed to be longer along the channel than a portion thereof to be used to constitute the n-channel transistor. This prevents the threshold voltage in the n-channel and p-channel transistors from scattering widely. Alternatively, the ion peak concentration of the ions implanted in the semiconductor substrate and the insulating material layer is located in the proximity of the boundary between the insulating material layer and the semiconductor substrate in the portion to be used to constitute the n-channel transistor, and is located in the semiconductor substrate apart from the insulating material layer in the portion to be used to constitute the p-channel transistor. This also enables the threshold voltage in the n-channel and p-channel transistors to be precisely controlled in the manufacturing processes.

4 Claims, 12 Drawing Sheets

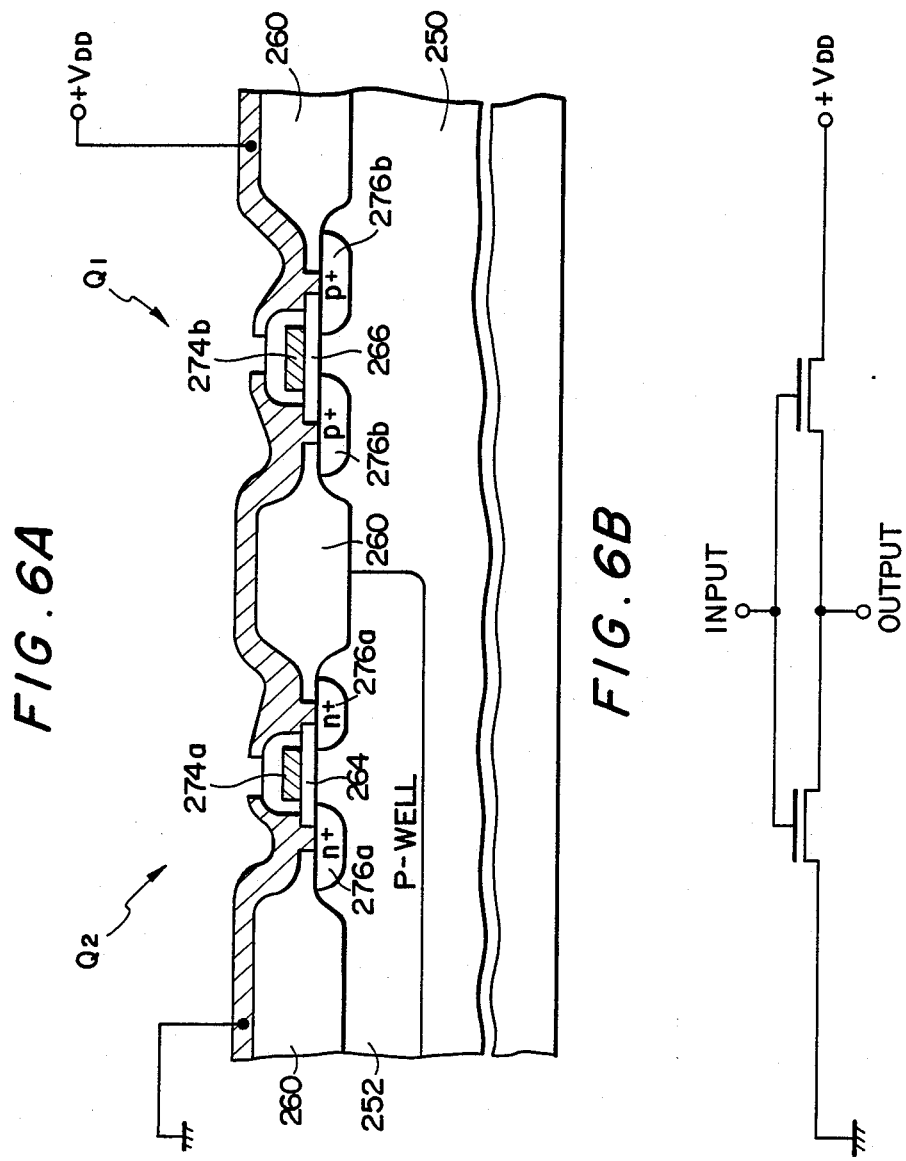

COMPLEMENTARY INSULATED-GATE FIELD EFFECT TRANSISTOR INTEGRATED CIRCUIT AND MANUFACTURING METHOD THEREOF

This application is a divisional of copending application Ser. No. 930,736, filed on Nov. 14, 1986 abandoned.

BACKGROUND OF THE INVENTION

1. Field of the Invention

The present invention relates to a complementary insulated-gate field effect transistor integrated circuit and a method of manufacturing the integrated circuit.

2. Description of the Prior Art

In manufacturing complementary insulated-gate field effect transistor integrated circuits (CMOSIC's), the device characteristics vary due to changes, such as those in temperature, manufacturing precision, and operations, in the process steps as the degree of device integration is increased, which leads to a disadvantage that the yield of products is lowered.

The changes in device characteristics include, for example, a change of a threshold voltage, Vt of a transistor.

In general, the threshold voltage Vt of an MOS transistor is expressed as follows:

$$Vt = \phi_{MS} + 2\phi_F - (Q_{SS} + Q_B + Q_{imp})T_{ox}/\epsilon\epsilon'$$

where,
- $\phi_{MS}$ = Work function of gate electrode material
- $\phi_F$ = Fermi potential
- $Q_{SS}$ = Surface state density (1/cm$^2$)
- $Q_B$ = Bulk electric charge (1/cm$^2$)
- $Q_{imp}$ = Impurity concentration of ions implanted in semiconductor substrate (1/cm$^2$)
- $T_{ox}$ = Insulation film thickness
- $\epsilon$ = Dielectric constant of vacuum
- $\epsilon'$ = Relative dielectric constant of insulation film material Consequently, if the changes of the Vt value due to the short-channel effect, narrow-channel effect, and the substrate bias effect are ignored, the variations of the $Q_{imp}$ and $T_{ox}$ are the main factors among the terms of the expression above which are related to the change of Vt.

The process step causing the change of the threshold voltage Vt is different between the p-type MOS and n-type MOS transistors in an IC having a very fine structure. In an n-type MOS transistor, the change of the thickness of the insulated film for the gate, $T_{ox}$ and the change of the amount of implanted ions, $Q_{imp}$ controlling the threshold voltage Vt on the portion of silicon substrate used as a channel below the insulated gate layer are the predominant factors to change the threshold voltage Vt; whereas, in a p-type MOS transistor, the change of the length of gate electrode, L and the change of the amount of implanted ions, $Q_{imp}$ in the portion of substrate to be used as a channel below the insulated gate layer are the main factors to change the threshold voltage Vt, Y.AOKI et. al., IEEE TRANS on Electron Device, vol. ED-31, 1984, p. 1462. Particularly, in an n-type MOS transistor, the thickness of the oxidized layer for the gate, $T_{ox}$ primarily changes the threshold voltage Vt; whereas, in a p-type MOS transistor, the gate length L mainly causes the threshold voltage Vt to change.

Consequently, in the process of manufacturing CMOS IC's having a fine structure, the change of the threshold voltage Vt due to the variation in the thickness of the gate layer $T_{ox}$ of an n-type MOS transistor and that in the gate length L of a p-type MOS transistor are required to be minimized.

Conventionally, the ion implantation condition for the p-type and n-type MOS transistors is set such that the ion acceleration energy is determined so that the ion implantation range $R_p$ simply exceeds the thickness of the insulated gate layer $T_{ox}$ as represent by the following expression.

$$R_p > T_{ox}$$

Consequently, in an n-type MOS transistor, when the energy for accelerating the ions to be implanted increases, the amount of the ions implanted into the semiconductor substrate $Q_{imp}$ does not change so much even if the thickness of the insulated gate layer $T_{ox}$ is changed, which leads to a disadvantage that the threshold voltage Vt varies primarily depending on the change in thickness of the insulated gate layer $T_{ox}$.

On the other hand, in a p-type MOS transistor, the ratio of the change of threshold voltage to the change of the thickness of the gate formed with an insulating material is relatively small when compared with the n-type MOS transistor; it is therefore necessary to mainly reduce the change of the amount of the ions implanted in the semiconductor substrate $Q_{imp}$.

SUMMARY OF THE INVENTION

It is therefore an object of the present invention to provide a complementary insulated-gate field effect transistor IC and a manufacturing method thereof which enables precise control over electric characteristics, especially, the gate threshold voltage in a CMOS LSI having a fine structure and which minimizes the dependency of the threshold voltage upon the variations in thickness of the insulated gate layer $T_{ox}$ of an n-type MOS transistor and gate length L of a p-type MOS transistor, thereby removing the disadvantage of the prior-art technique.

Another object of the present invention is to provide a complementary insulated-gate field effect transistor IC with a high yield in manufacturing in which the dependency of the threshold voltage Vt upon thickness of the insulated gate layer $T_{ox}$ is minimized for both the n-type and p-type MOS transistors.

According to the present invention, there is provided a complementary insulated-gate field effect transistor IC comprising a semiconductor substrate, a layer formed with an insulating material on a primary surface of said semiconductor substrate, and a layer formed with an electrode material on said insulating material layer so as to form insulated-gate field effect transistors of the p-channel and n-channel types wherein the layer formed with an insulating material is thicker in a portion related to the n-channel transistor than in a portion related to the p-channel transistor, and the layer of an electrode material is longer along the channel in the p-channel transistor than in the n-channel transistor.

The IC is manufactured in the following method, which comprises a first step of forming a well of one conductivity type on a primary surface of a silicon substrate, a second step of disposing an oxide layer on the primary surface and of forming a nitride layer on the oxide layer, a third step of etching the nitride layer excepting a region to be used for a transistor, a fourth step of implanting ions, to form field oxide layers, a fifth step of achieving an etching with the region for the p-channel transistor being masked so as to remove the nitride layer and the oxide layer in the region for the n-channel transistor, a sixth step of growing an oxide layer in the region for the n-channel transistor, a seventh step of achieving an etching with the region for the n-channel transistor being masked so as to remove the nitride layer and the oxide layer in the region for the p-channel transistor, an eighth step of growing an oxide layer in the region to be used to form the transistors of the p-channel and n-channel types, a ninth step of depositing a polycrystalline silicon layer on the primary surface, a tenth step of implanting a first impurity substance in the region for the n-channel transistor and activating the first impurity substance with the region for the p-channel transistor being masked in the polycrystalline silicon layer, an 11th step of implanting a second impurity substance in the entire polycrystalline silicon layer with the mask being removed, a th step of forming a mask having substantially the same strip width on a surface of the polycrystalline silicon layer associated with a gate electrode of the transistor, a 13th step of achieving a plasma etching to remove portions not covered with the polycrystalline silicon layer, and a 14th step of diffusing a third impurity substance having a higher diffusion constant in the region of the polycrystalline silicon layer for the p-channel transistor with the mask being removed and of diffusing a fourth impurity substance having a lower diffusion constant in the region of the polycrystalline silicon layer for the n-channel transistor, thereby forming source and drain regions of the transistors.

Moreover, according to the present invention, there is provided a complementary insulated-gate field effect transistor IC having a semiconductor substrate, a layer formed with an insulating material on a primary surface of the semiconductor substrate, and a layer formed with an electrode material on the insulation layer so as to form MOS transistors of the p-channel and n-channel types in which ions are implanted in the semiconductor substrate for controlling the gate threshold voltage of the MOS transistors wherein the ion peak concentration for the n-channel transistor is positioned in the vicinity of a boundary between the insulating material layer and the semiconductor substrate, and the ion peak concentration for the p-channel transistor is set at a location in the semiconductor substrate, the location being apart from the insulating material layer.

BRIEF DESCRIPTION OF THE DRAWINGS

The objects and features of the present invention will become more apparent from the consideration of the following detailed description taken in conjunction with the accompanying drawings in which:

FIG. 6A is a cross-sectional view illustrating an alternative embodiment of the complementary insulated-gate field effect transistor IC according to the present invention;

FIG. 6B, is a schematic diagram illustrating an equivalent circuit of the IC of FIG. 6A;

DETAILED DESCRIPTION OF THE PREFERRED EMBODIMENTS

Referring to the accompanying drawings, the embodiments of the insulated-gate field effect transistor IC of the present invention will be described in details.

Figure 1:
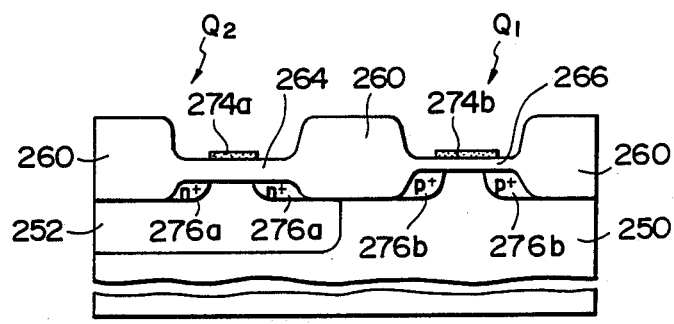
FIG. 1 is a schematic cross-sectional view illustrating an embodiment of the complementary insulated-gate field effect transistor IC according to the present invention.

FIG. 1 shows an embodiment of the insulated gate field effect transistor IC according to the present invention. A p-channel transistor Q1 and an n-channel transistor Q2 are formed in a primary surface of a silicon substrate 250. The p-channel transistor Q1 includes two p+diffusion regions 276b, 276b formed on the substrate 250 and a gate electrode 274b formed therebetween, for example, with a polycrystalline silicon layer disposed on a gate oxide layer 266 on the primary surface. The n-channel transistor Q2 comprises two n+diffusion regions 276a, 276a formed in a p-type well disposed on the primary surface of the substrate 250 and a gate electrode 274a formed therebetween, for example, with a polycrystalline silicon layer disposed on a gate oxide layer 264 on the primary surface. Between the p-channel transistor Q1 and the n-channel transistor Q2, a field oxide layer 260 is formed to serve as a region separating these transistors, namely, a device separation region.

The thickness of the gate oxide layer 264 of the n-channel transistor Q2 is designed to be greater than that of the gate oxide layer 266 of the p-channel transistor Q1, thereby setting the ratio $\beta R$ of the gain constant $\epsilon 1$ of the p-channel transistor Q1 to the gain constant $\beta 2$ of the n-channel transistor Q2 to a predetermined value.

The gate electrode 274b of Q1 is formed to be longer than the gate electrode 274a of Q2, however, the area of the diffusion regions 276b, 276b is greater than that of the diffusion regions 276a, 276a; consequently, the effective length of the channel formed below the gate electrode 274a is substantially equal to that of the channel formed below the gate electrode 274b.

Referring now to FIGS. 2A–4B, a description will be given of an example of the process of manufacturing the complementary IGFET (CMOS) IC of FIG. 1. In this process, the transistor is manufactured so that the thickness of the gate oxide and the length of the gate vary between the transistors Q1 and Q2, respectively.

Figure 2A:
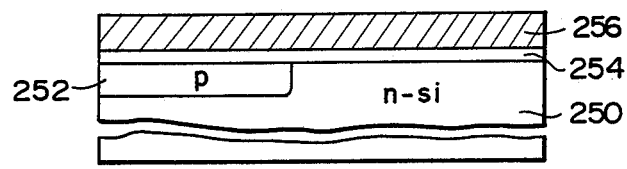
FIGS. 2A–2J are explanatory cross-sectional views stepwise showing the main steps of the process of manufacturing the IC of FIG. 1.
Figure 2B:
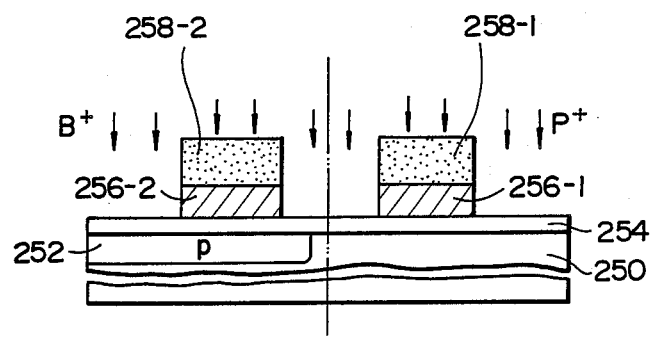
Figure 2C:
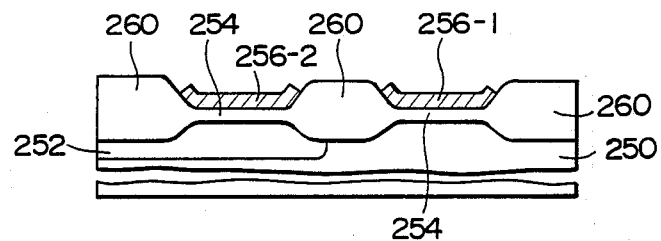

First, on a primary surface of a silicon substrate 250, a p-type well 252 is formed as shown in FIG. 2A. A pad oxide layer 254 is formed on the primary surface of the silicon substrate 250 and then a nitride layer 256 is disposed on the oxide layer 254. The thickness of the oxide layer 254 and that of the nitride layer 256 may be, for example, about 300–1000 Å and about 1000–2000 Å, respectively.

Next, these layers are covered with a photoresist, which is then developed so that the nitride layer 256 is subjected to a plasma etching with the regions to be used to form the transistor kept remained. The remaining portions include nitride layers 256-1 and 256-2 and photoresist films 258-1 and 258-2. B+ ions and P (phosphoric) ions are implanted in the n-channel and p-channel transistor regions, respectively to form the field oxide layer 260 as a device separation regions, FIG. 2C.

Figure 2D:
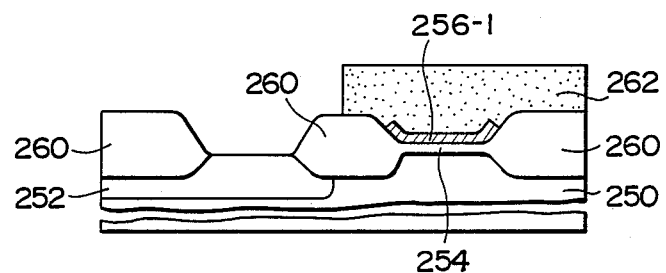

The region for the p-channel transistor, namely, the region to be used to form a thin gate oxide layer is covered with a photoresist 262 as shown in FIG. 2D and then the exposed portion of the nitride layer 256-2 is removed through a plasma etching. To form the photoresist 262, the mask used to establish the p-type well 252 can also be utilized. A wet etching is then achieved to remove the exposed pad oxide layer 254, FIG. 2D.

Figure 2E:
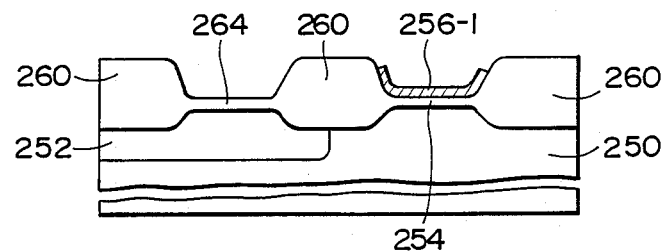

Next, the photoresist 262 is removed and the gate oxide layer 264 is formed, FIG. 2E.

As described above, the region for the n-channel transistor, namely, the region to be used to form the thicker gate oxide layer is covered with a photoresist film, and then a plasma etching is carried out to remove the exposed nitride layer 256-1. For the formation of the photoresist, a mask obtained by inverting the mask pattern used to form the p-type well 252 is utilized. Thereafter, a wet etching is accomplished to remove the exposed oxide layer 254.

Figure 2F:
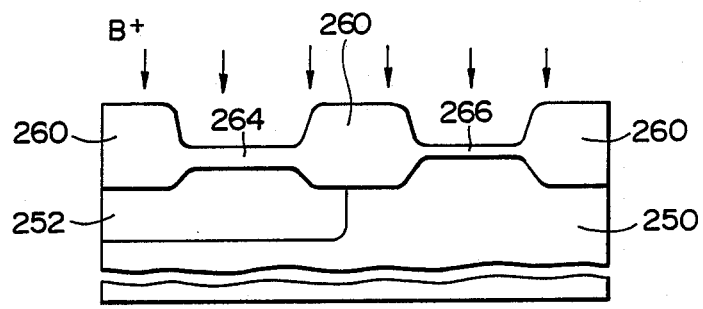

The photoresist is removed and the gate oxide layers 264 and 266 are grown, and then B+ions are implanted therein so as to simultaneously control the threshold voltage for the p-channel and n-channel FET's, FIG. 2F. If the threshold levels of the p-channel and n-channel FET's are desired to be separately controlled, the ion implantation process may be separately performed for the FET's regions.

In this example, the insulation layer 264 is formed to be thicker than the insulation layer 266, which can be controlled through two oxidation processes.

The oxidation time for the two oxidation processed to form the oxide layers is determined such that the ratio of the thickness d1 of the insulated gate layer of the n-channel FET to the thickness d2 of the insulated gate layer of the p-channel FET is substantially about 2.5.

Figure 5:
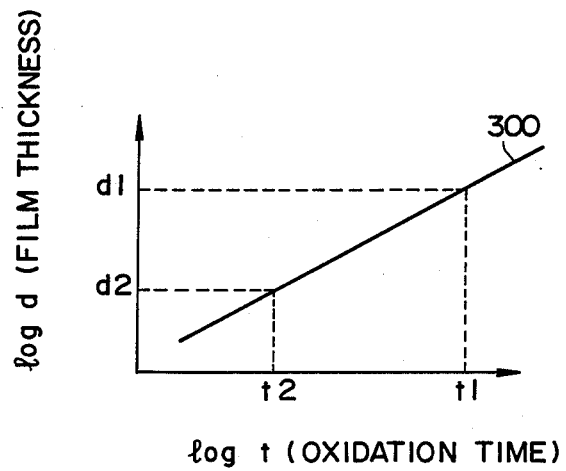
FIG. 5 is a graph demonstrating the relationships between the oxidation time and the thickness of the insulated gate layer.

In such a manufacturing process, the ratio between thicknesses of the gate oxide layers of the two transistor regions in the inverter of the nonratio type is, provided that these two transistors each have the same length and width, set to be substantially about 2.5 according to the ratio $\beta R$ of the gain constant described above. Consequently, in the foregoing example, assuming the thicknesses d1 and d2 of the oxide layers 264 and 266 to be 1000Å and 400Å, respectively, the period of time required for the oxidation can be obtained according to the direct line 300 logarithmically plotted in FIG. 5. That is, the oxidation time required to form the first gate oxide layer 264, FIG. 2E is determined as t1–t2 from this graph.

Figure 2G:
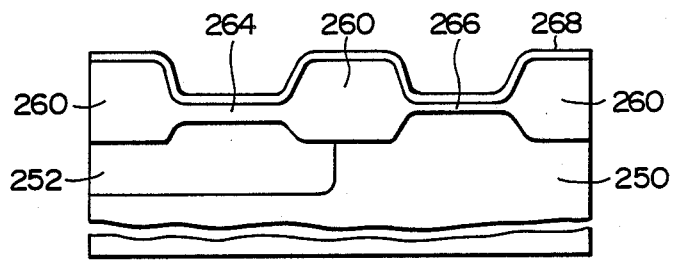

Next, a polycrystalline silicon layer 268 is formed on the surface, FIG. 2G. The surface of the polycrystalline silicon layer 268 is then oxidized, for example, up to a depth of about 1000Å to form an oxidized silicon layer 270. The region in the right half of the diagram, namely, the region to be used to form the p-channel MOS transistor is masked and is then subjected to a wet etching, which removes the oxidized silicon layer 270 on the surface of the p-type semiconductor or p well in the left half of the diagram. Leaving the IC body in an atmosphere of POCl$_3$, P or phosphor atoms are thermally diffused into the polycrystalline silicon layer 268 in the left half of the diagram of FIG. 2H.

The polycrystalline silicon oxide layer 270 remaining on the primary surface is completely removed, and then P or As ions are implanted in the primary surface. The ion implantation is conducted under conditions of, for example, acceleration energy of about 50–200 KeV and concentration of about $0.5-2 \times 10^{16}$ cm$^{-2}$, FIG. 2I. To form the electrode layer 268 having a high conductivity, P or As atoms are doped in the polycrystalline silicon layer 268. It is here characteristic that amount of the doped P or As ions are greater and more activated in the region for the n channel on the left as compared with the region for the p channel on the right. This provision helps conduct the plasma etching in the following process more isotropically for the electrode layer 268 in the left-side region than for the electrode layer 268 in the right-side region.

Figure 2H:
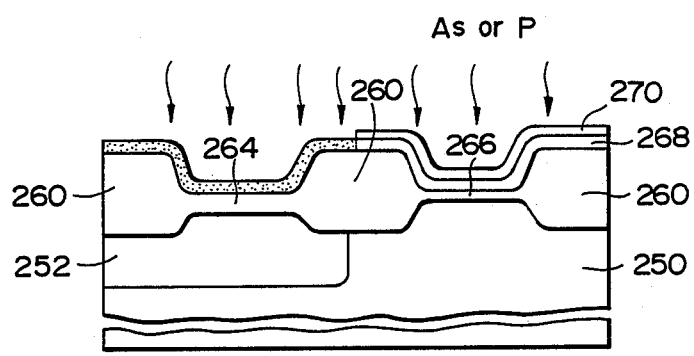
Figure 2I:
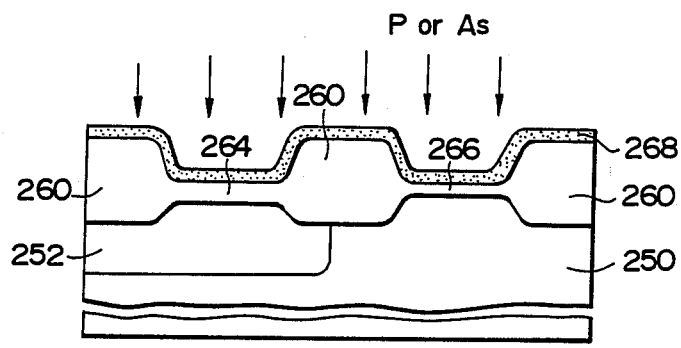
Figure 2J:
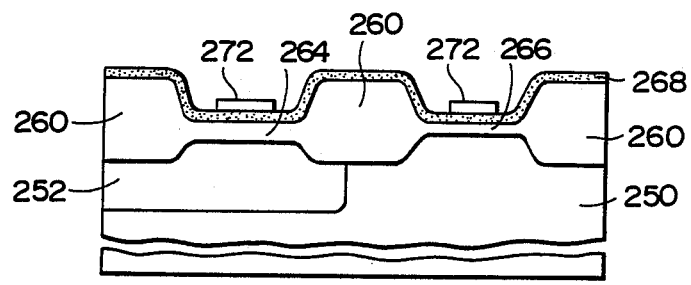
Figures 3A, 3B:
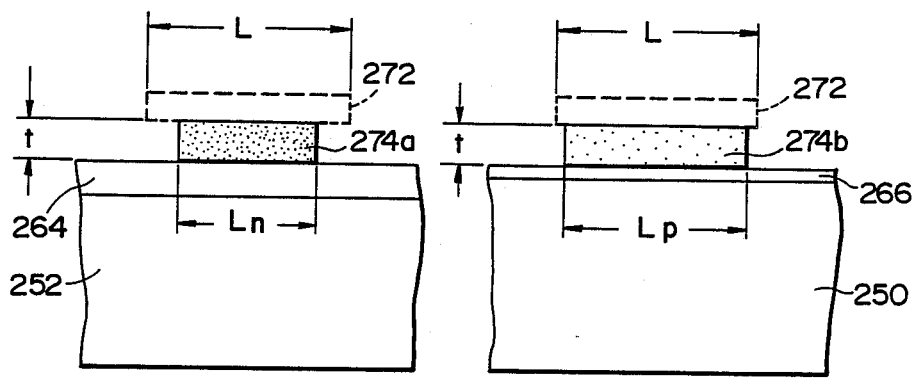
FIGS. 3A–3B and FIGS. 4A–4B are partly magnified cross-sectional views stepwise depicting the process following that of FIG. 2J for the p-channel and n-channel regions, respectively.
Figure 4A:
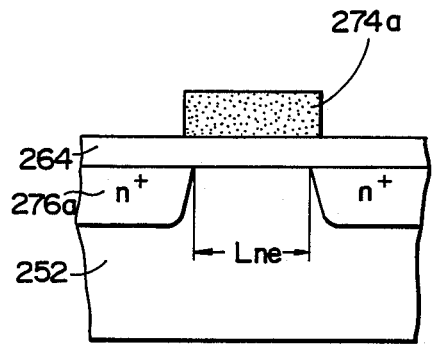
Figure 4B:
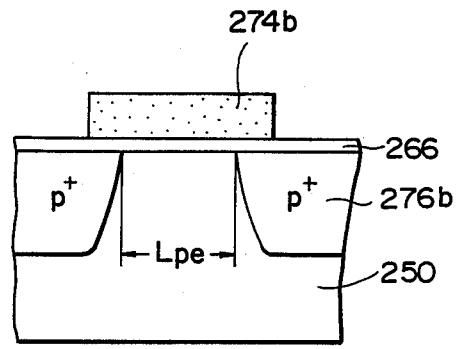

Next, as shown in FIG. 2J, a mask is formed to manufacture polycrystalline silicon gate electrodes 274a and 274b (FIGS. 3A–3B) of the MOS transistor. The mask may be an ordinary photoresist. The width of the mask region 272 corresponding to the gates 274a–274b need not be changed between the p-channel and n-channel MOS transistors as shown in FIGS. 3A–3B. The width may be substantially the same, L. The polycrystalline silicon layer is then subjected to a plasma etching. The subsequent processes may be the same as those for manufacturing an ordinary CMOS.

FIGS. 3A–3B are enlarged cross-sectional diagrams illustrating magnified portions of the electrodes 274a and 274b, respectively after the plasma etching. As can be seen from FIGS. 3A–3B, the width Ln of the gate electrode 274a constituting the n-channel MOS transistor is formed to be smaller than the width Lp of the electrode 274b forming the p-channel MOS transistor. This is because the concentration of the phosphor ions doped in the polycrystalline silicon layer 268 is higher in the gate electrode 274a than in the gate electrode 274b and the impurity substance is not fully activated in the gate electrode 274b, which leads to a more isotropic etching for the gate electrode 274a and to a more anisotropic etching for the gate electrode 274b.

In more detail, a description will be given in a two-dimensional fashion with respect to the planes of FIGS. 3A–3B in which while the same thickness of the polycrystalline silicon layer 268 or the same depth t of the silicon layer 268 along a direction perpendicular to the primary surface of the substrate 250 is etched, the length L - Ln of the gate electrode 274a and the smaller length L - Lp of the gate electrode 274b are etched in the same period of time. The mask is removed when the etching is finished.

In the subsequent process, to form source and drain regions 276a–276b of the MOS transistor, As and B ions are implanted by use of the ion implantation method in the regions 276a and 276b, respectively, and the implanted As and B ions are diffused later in a thermal process.

As is commonly known, since the diffusion constant of boron is higher than that of arsenic, the depth and width of the p+region 276b formed by the boron diffusion are greater than those of the n+region 276a formed by the arsenic diffusion. As a consequence, in the final CMOS device, the effective lengths Lne and Lpe of the channels established below the gate electrodes 274a and 274b, respectively are substantially identical to each other for the p-channel and n-channel MOS transistors, respectively. In other words, to substantially equalize these lengths, the processes of FIGS. 2H-2I are performed to control the amount of the doped phosphor ions and the degree of phosphor ion activation in the regions of the polycrystalline silicon layer 268 determining the strip widths Ln and Lp of the electrode 274a and 274b, respectively.

Moreover, B+ions are implanted again to simultaneously control the threshold voltage for the p-channel and n-channel FET's, thereby implementing the IC of FIG. 1. If the threshold voltage is desired to be separately controlled for the n-channel and p-channel FET's, the ion implantation process may be separately conducted for the regions of the n-channel and p-channel transistors.

After this process, the processes of manufacturing an ordinary CMOS is advantageously used, namely, the polycrystalline silicon layer is oxidized, an insulation layer is formed between other layers, PLTO is disposed, contact holes are formed, an aluminum electrode layer is disposed, the patterning is conducted thereon, and a protective layer is formed. After these processes are finished, the MISFET IC is completed.

According to the embodiment, the thickness $T_{ox}$ of the gate oxide layer 264 of the n-channel MOS transistor is formed to be greater than that of the gate oxide layer 266 of the p-channel MOS transistor. Consequently, to form the gate oxide layer 264 of the n-channel MOS transistor, the control of the layer thickness can be easily accomplished because a long period of time is necessary to form the oxide layer by oxidizing the semiconductor substrate. That is, for the n-channel MOS transistor, the gate oxide layer has a great thickness $T_{ox}$ and hence the ratio of the variation thereof is small. Contrarily, for the p-channel MOS transistor, the gate oxide has a small thickness $T_{ox}$ and thus the ratio of the variation thereof is great. However, this is not a problem because the dependence of the Vt value on the thickness of the gate oxide layer is less clear in the p-channel MOS transistor when compared with the n-channel MOS transistor.

As described above, in an n-channel MOS transistor, the influence of the change of the thickness of the gate oxide layer mainly causing the change of the threshold voltage Vt can be minimized, thereby improving the yield of the products.

In addition, the length of the gate electrode of the p-channel MOS transistor is set to be greater than that of the gate electrode of the n-channel MOS transistor so as to equalize the effective channel lengths Lne and Lpe. Consequently, even if the length L of the gate electrode is changed when forming the gate electrode by an etching, the change ratio of the gate electrode length L of the p-channel MOS transistor is smaller than that of the gate electrode length L of the n-channel MOS transistor. That is, when the same change of the gate electrode length L occurs in the p-channel and n-channel MOS transistors, the change ratio of the gate electrode length L of the p-channel MOS transistor is smaller because the gate electrode length L of the p-channel MOS transistor is longer than that of the n-channel MOS transistor. In contrast, the change ratio of the gate electrode length L is greater in the n-channel MOS transistor.

According to the manufacturing method of the embodiment, when forming the electrodes 274a-274b through the plasma etching, the former is subjected to the more isotropic etching and the latter is subjected to the more anisotropic etching. As a consequence, since the etching state of the p-channel MOS transistor is almost isotropic, the change of the gate electrode length L is reduced. According to the embodiment as described above, since the primary factor of the change in the threshold voltage Vt of the p-channel MOS transistor, namely, the effect of the change in the gate electrode length L can be minimized, the yield of the products is improved.

In addition, for example, when manufacturing CMOS's, the different masks are ordinarily used for the p-channel and n-channel transistors. This may be applied to establishing the different device structures in the channel regions to be used for the n and p channels in a transistor. The control of the layer thickness can be readily implemented by devising the thermal oxidation process without using the etching processes such as the plasma etching and wet etching. A high controllability of the layer thickness is therefore realized depending on the oxidation time.

Since the CMOS's inherently have the nonratiotype structure, the $\beta$ ratio need only be set, to optimize the operation speed, to be substantially identical to the ratio between the carrier mobilities determining the values of $\beta$ for the p-channel and n-channel transistors. Namely, the $\beta$ ratio is set to about 1.5-3.5, and preferably, to about 2-3. For example, in the prior art NMOS, the $\beta$ ratio must be set to 4-6. In contrast, the $\beta$ ratio of the embodiment may be half that of the conventional NMOS, which can be easily implemented in the manufacturing process.

Since the gate oxide layer of the p-channel transistor region is thin, the absolute value of the threshold voltage tends to be minimized, which unnecessitates to increase the dose of boron ions implanted to control the threshold voltage. Consequently, in a state where the transistor is turned off, increase of the leakage current flowing into the substrate is prevented.

Although the gate oxide layer of the n-channel transistor region is set to be thicker than that of the p-channel transistor region, the former is at most about 3.5 times the latter, which leads to a characteristic that only a reduced amount of the enhancement ion implantation is required.

Moreover, the amount of the doped phosphor ions and the degree of activation thereof in the region of the polycrystalline silicon layer defining the gate electrode width are so controlled that the effective length of the channels formed below the gate electrodes in the final CMOS device are substantially the same for the p-channel and n-channel MOS transistors. This enables to extremely reduce the differences in the mask design and the manufacturing processes with respect to the p-channel and n-channel MOS transistors, thereby implementing a complementary MOS device having substantially a little variation in the device shape and characteristic between the p-channel and n-channel MOS transistors.

Although the embodiment of the CMOS structure has been described in a case where a p-type well is formed in an n-type substrate, the present invention is naturally applicable to other CMOS structures such as a structure having an n-type well formed in the p-type substrate and a structure formed through an epitaxial growth.

According to the present invention, the thickness $T_{ox}$ of the gate oxide layer of the n-channel MOS transistor is formed to be greater than that of the gate oxide layer of the p-channel MOS transistor, and hence the primary factor causing the change of the threshold voltage Vt of the n-channel MOS transistor, namely, the influence of the change in the thickness $T_{ox}$ of the gate oxide layer can be minimized.

Moreover, since the gate electrode of the p-channel MOS transistor is formed to be longer than that of the n-channel MOS transistor, the main factor causing the change of the threshold voltage of the p-channel MOS transistor, namely, the influence of the change of the gate electrode length L can be reduced.

As a consequence, the change of the threshold voltage Vt is minimized and the yield of the products is improved.

FIG. 6A shows another embodiment of the insulated-gate FET IC according to the present invention. In this cross-sectional view, a p-channel transistor Q1 and an n-channel transistor Q2 are formed in a primary surface of a silicon substrate 250. The p-channel transistor Q1 includes two p+diffusion regions 276b, 276b formed in the substrate 250 and a gate electrode 274b formed therebetween, for example, with a polycrystalline silicon layer on a gate oxide layer 266 in the primary surface. The n-channel transistor Q2 comprises two n+diffusion regions 276a, 276a disposed in a p-type well 252 formed in the primary surface of the substrate 250 and a gate electrode 274a formed therebetween, for example, with a polycrystalline silicon layer on a gate oxide layer 264 in the primary surface. Between the p-channel and n-channel transistors Q1 and Q2, a field oxide layer 260 is formed to serve as a device separation region separating Q1 and Q2.

FIG. 6B is a diagram showing an equivalent circuit of FIG. 6A.

In general, the distribution of ions immediately after the ion implantation (before the annealing process) can be approximated by the Gaussian distribution.

Figure 7A:
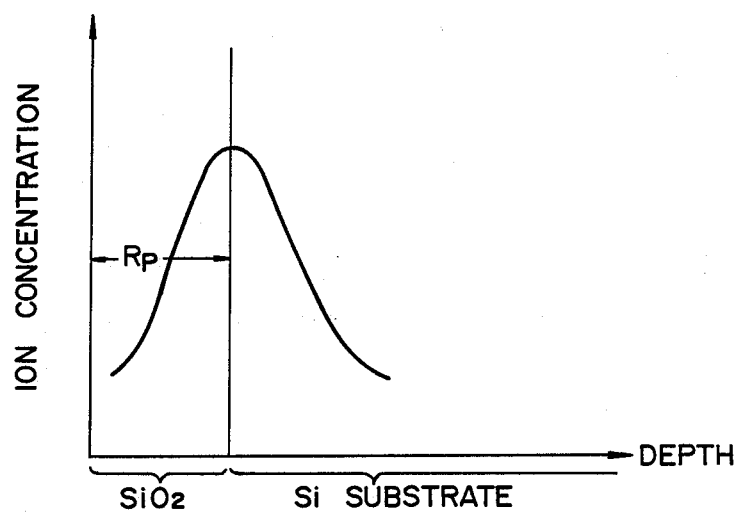
FIGS. 7A–7B are graphs showing the distribution of the amount of implanted ions for the n-channel and p-channel transistors, respectively of the complementary insulated-gate field effect transistor IC of FIG. 6A.
Figure 7B:
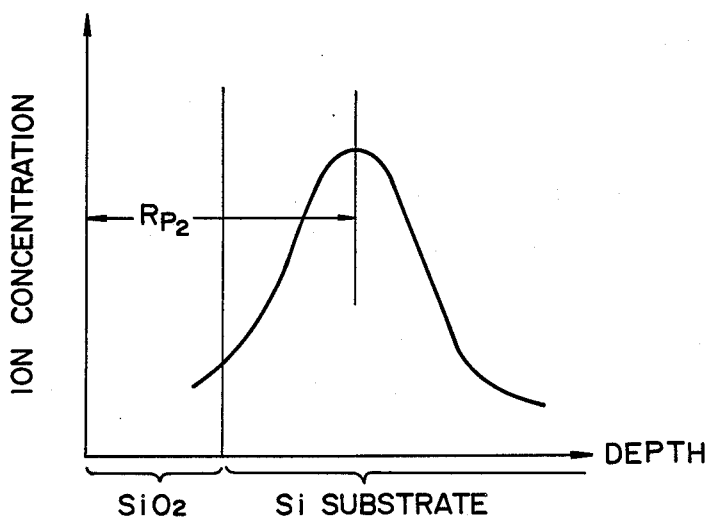

FIG. 7A is a graph illustrating the distribution of the amount of implanted ions $Q_{imp}$ in the gate oxide layer 264 and the p-type well below the gate electrode 274a of the n-channel transistor Q2 according to the embodiment, whereas FIG. 7B is a graph demonstrating the distribution of the amount of implanted ions $Q_{imp}$ in the gate oxide layer 266 and the substrate 250 below the gate electrode 274b of the p-channel transistor Q1.

Figure 8A:
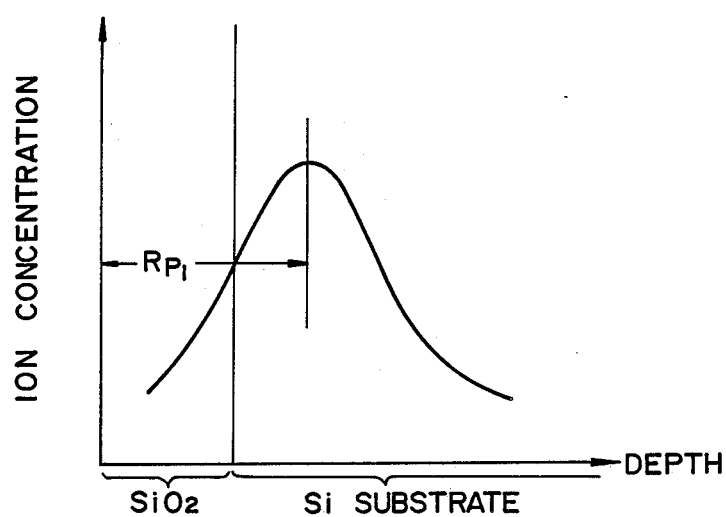
FIGS. 8A–8B are graphs plotting the distribution of the amount of implanted ions for the n-channel and p-channel transistors, respectively of the conventional complementary insulated-gate field effect transistor IC.
Figure 8B:
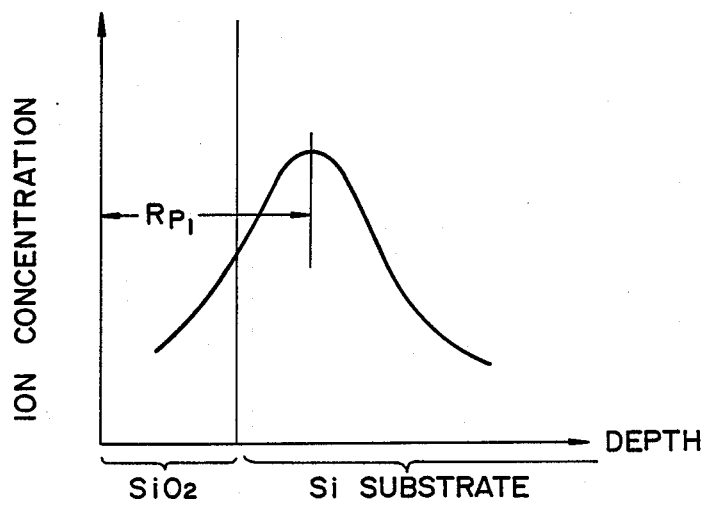

For comparison, FIGS. 8A-8B show the distribution of the amount of implanted ions $Q_{imp}$ in the conventional n-channel and p-channel transistors Q2 and Q1, respectively in which $R_p$ is the ion implantation range in $SiO_2$ and $R_{p1}$ and $R_{p2}$ indicate ion implantation ranges in the layers of $SiO_2$ and Si, where $R_p < R_{p1} < R_{p2}$. If boron ions are implanted into the n-channel and p-channel transistors under the same ion implantation conditions, the ion implantation ranges in the layers of $SiO_2$ and Si are substantially identical to each other for both transistors.

In the n-channel transistor Q2 of the embodiment, as shown in FIG. 7A, boron ions are implanted to locate the peak of distribution at a position in the vicinity of the boundary between the gate oxide layer 264 and the substrate 250, namely, the ion implantation range $R_p$ is substantially equal to the thickness $T_{ox}$ of the gate oxide layer 264. Consequently, when compared with the conventional distribution of FIG. 8B, the amount of ions implanted in the gate oxide layer 264 is increased, and hence the ion implantation quantity $Q_{imp}$ is changed according to a variation of the thickness $T_{ox}$ of the gate oxide layer. In other words, as the thickness $T_{ox}$ of the gate oxide layer increases, the ion implantation quantity $Q_{imp}$ is decreased; contrarily, as the thickness of the gate oxide layer reduces, the ion implantation quantity $Q_{imp}$ increased. When boron ions are implanted in an n-channel transistor to control the threshold voltage at the channel ion implantation, the threshold voltage Vt is approximated as, $$Vt \; \alpha Q_{imp} \cdot T_{ox}$$

That is, the threshold voltage Vt is proportional to the product of the ion implantation quantity $Q_{imp}$ and the thickness $T_{ox}$ of the gate oxide layer. As described above, in a case where the relationships that the ion implantation quantity $Q_{imp}$ decreases with the increasing thickness $T_{ox}$ of the gate oxide layer, and vice versa are satisfied, the change of the Vt value related to the variation of the thickness $T_{ox}$ of the gate oxide layer and the change of the Vt value associated with the variation of $Q_{imp}$ tend to cancel each other, and hence the threshold voltage Vt is substantially fixed. Consequently, the change of the threshold voltage Vt due to the variation of the thickness $T_{ox}$ of the gate oxide layer can be minimized.

These relationships will be described with reference to experimental results in the following paragraphs.

Figure 10A:
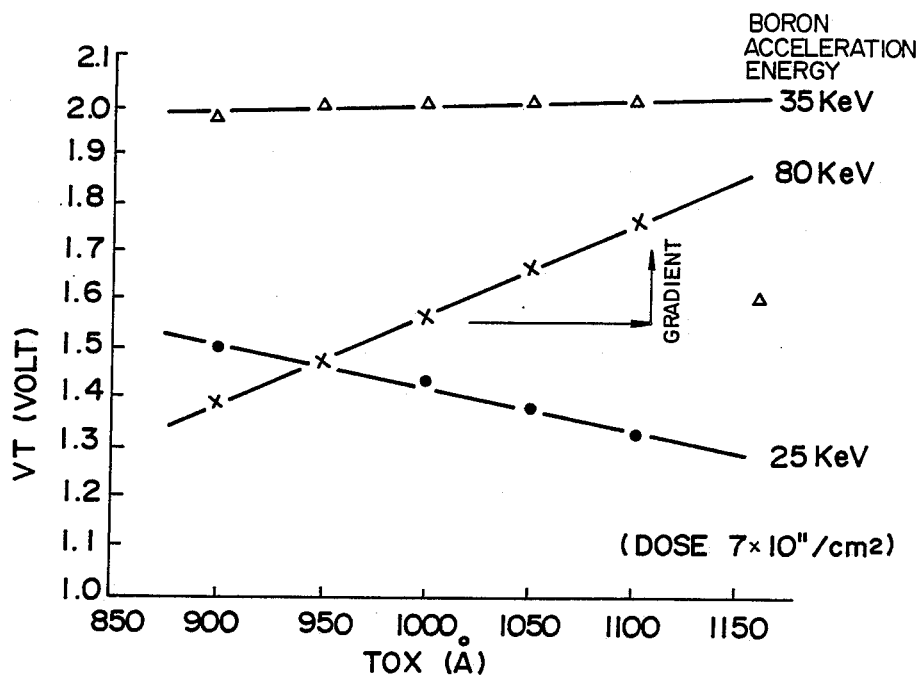
FIG. 10A is a graph depicting the changing rate $\Delta$ of the threshold voltage Vt with respect to the change of the thickness of the insulated gate layer.

FIG. 10A is a graph illustrating the relationships between the gate threshold voltage and the thickness $T_{ox}$ of the gate oxide layer in an MOS structure in which a 900Å–1100Å thick gate oxide layer is grown in a p-type well on a p-type or n-type substrate (impurity concentration is $2 \times 10^{15}/cm^3$) and an n-type doped polycrystalline silicon electrode is disposed on the gate oxide layer. As can be seen from the graph, when the acceleration energy is changed at the boron ion implantation, the change ratio $\Delta mV/Å$ of the change of the threshold voltage Vt to the variation of the thickness of the gate oxide layer is altered (ion implantation dose $= 7 \times 10^{11}/cm^2$).

As a consequence, the change ratio $\Delta$ of the Vt value with respect to the variation of the thickness of the gate oxide layer can be minimized by controlling the ion acceleration energy.

Figure 10B:
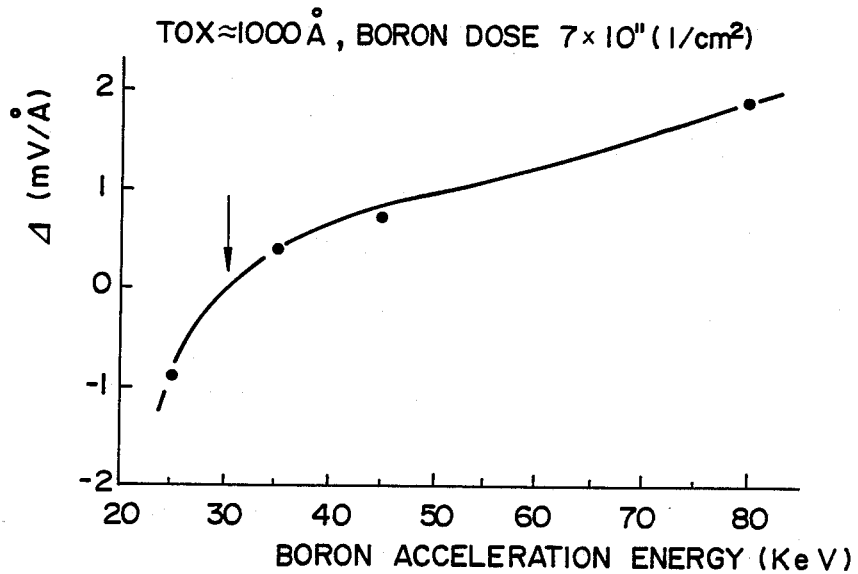
FIG. 10B is a graph showing the changing rate $\Delta$ of the threshold voltage Vt with respect to the ion acceleration energy and the change of the thickness of the insulated gate layer.

FIG. 10B is a graph illustrating the relationships between the ion acceleration energy and the changing ratio $\Delta$. As can be seen from this graph, when the boron acceleration energy is selected to be about 30 KeV, the change of the Vt value is minimized in an n-type MOS transistor. On the other hand, since the implantation range $R_p$ is about 1000Å when boron ions are implanted in a gate oxide layer of $SiO_2$ with the acceleration energy set to 30 KeV, the peak of the distribution of implanted ions is found to exist on the boundary between the gate oxide layer of $SiO_2$ and the substrate of Si.

Even if the peak of the ion implantation distribution is not exactly on the boundary between the gate oxide layer 264 and the substrate, above-mentioned effect can be obtained if the peak exists in the vicinity of the boundary.

In the p-channel transistor Q1, as shown in FIG. 7B, boron ions are implanted so that the peak of the ion implantation distribution is apart from the gate oxide layer 266, namely, the ion implantation range $R_p$ exceeds the thickness $T_{ox}$ of the gate oxide layer. Consequently, when compared with the conventional ion implantation distribution illustrated in FIG. 8B, the amount of ions implanted into the gate oxide layer 266 is greatly reduced and hence the amount of the implanted ions $Q_{imp}$ *does not vary depending on the change of the thickness $T_{ox}$* of the gate oxide layer. That is, even if the thickness $T_{ox}$ of the gate oxide layer varies, the amount of the implanted ions $Q_{imp}$ *is substantially fixed.*

In the p-channel transistor, the change of the threshold voltage Vt depends on the variation of the amount of the implanted ions $Q_{imp}$ *and does not depend on the variation of the thickness $T_{ox}$* of the gate oxide layer as compared with the n-channel transistor; consequently, by setting the ion implantation quantity $Q_{imp}$ *to a constant, the change of the threshold voltage Vt can be reduced.*

Referring now to FIGS. 9A–9G, a description will be given of an example of a process for manufacturing the complementary insulated-gate field effect transistor (CMOS) IC according to the present invention.

Figure 9A:
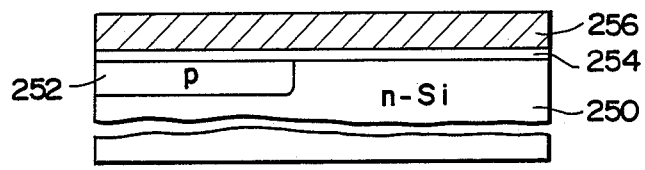
FIGS. 9A–9G are explanatory cross-sectional views stepwise illustrating main steps of the process of manufacturing the IC of FIG. 6A.

First, a p-type well 252 is formed on a primary surface of a silicon substrate 250 as shown in FIG. 9A. A pad oxide layer 254 is disposed on the primary surface and then a nitride layer 256 is formed on the pad oxide layer 255. The thicknesses of the oxide layer 254 and the nitride layer 256 may be about 300–1000Å and about 1000–2000Å, respectively.

Next, these layers are covered with a photoresist layer, which is then developed so that the nitride layer 256 is subjected to a plasma etching with the region for a transistor being remained. The remained portion includes nitride layers 256-1 and 256-2 and the photoresist (not shown) disposed thereon. B+ions and P (phosphor) ions are implanted in the n-channel and p-channel regions, respectively so as to form a field oxide layer 260 as a device separation region, FIG. 9B.

Figure 9B:
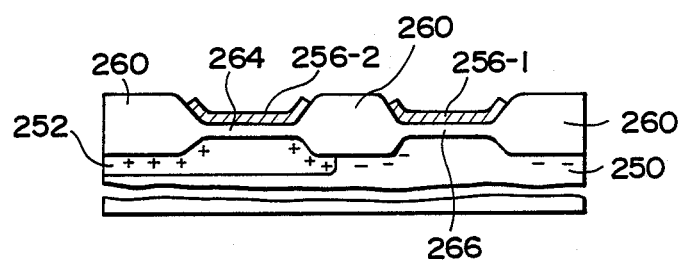
Figure 9C:
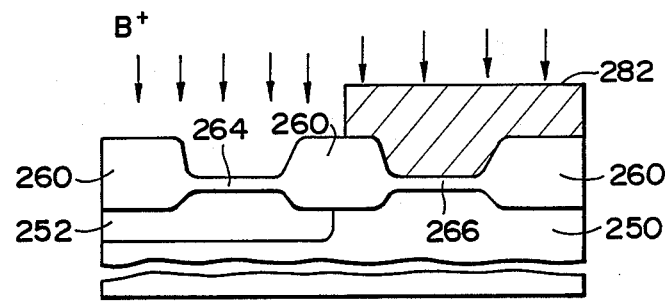
Figure 9D:
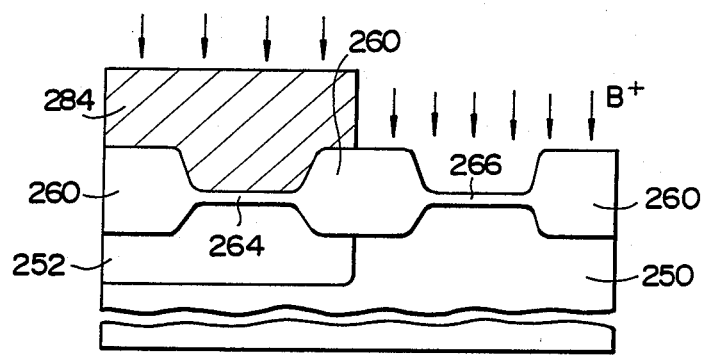

Gate oxide layers 264 and 266 are grown, FIG. 9B, and then by use of photoresist layers 282 and 284, B+ions are implanted according a predetermined dose with a predetermined acceleration energy, thereby separately controlling the threshold voltage of the p-channel and n-channel FET's, FIGS. 9C–9D.

Here, in the n-channel transistor Q2, as shown in FIG. 7A, the B+ions of about $1-8 \times 10^{11}/cm^2$ are implanted with the ion implantation energy set to, for example, 30 KeV so that the peak of the B+ion distribution is in the neighborhood of the boundary between the gate oxide layer and the substrate, namely, the ion implantation range $R_p$ is equal to the thickness $T_{ox}$ of the gate oxide layer, FIG. 9D.

In the p-channel transistor Q1, as shown in FIG. 7B, boron ions of about $0.5-5 \times 10^{11}/cm^2$ are implanted with the ion implantation energy set to greater than 30 KeV, for example, 40 KeV so that the peak of the ion distribution is apart from the gate oxide layer 266, namely, the ion implantation range $R_p$ is satisfactorily greater than the thickness $T_{ox}$ of the gate oxide layer, FIG. 9C.

Figure 9E:
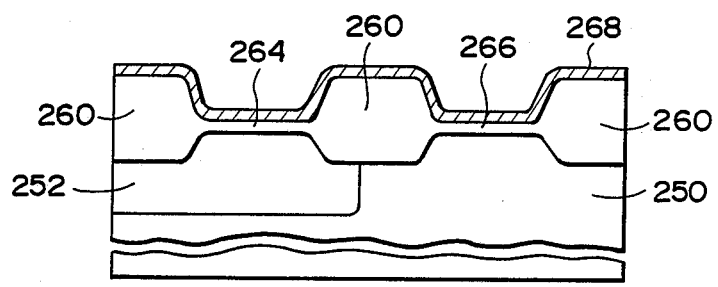
Figure 9F:
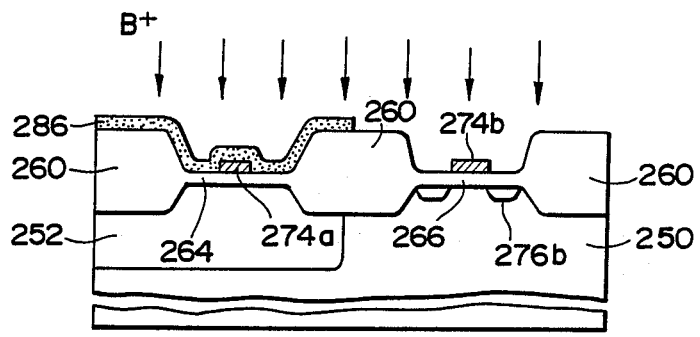
Figure 9G:
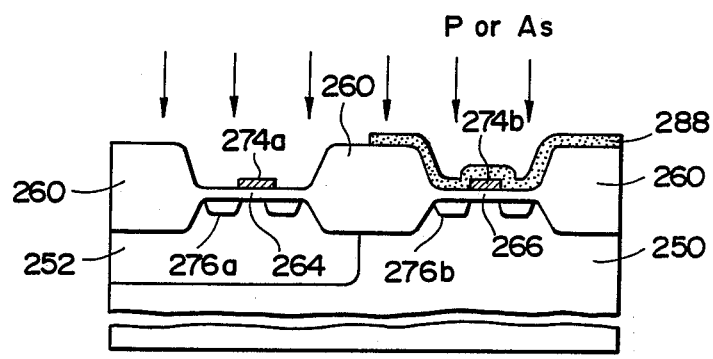

Next, to form the gate electrode, a polycrystalline silicon layer 268 is disposed as shown in FIG. 9E and the IC body is subjected to a plasma etching to remove the portions excepting the necessary portions such as the gate electrode regions. Moreover, to form a source region and a drain region, photoresist layers 286 and 288 are applied to the p-type and n-type MOS transistors, respectively, and then B and As or P ions are implanted in the p-type and n-type MOS transistors, respectively to obtain a high impurity concentration, FIGS. 9F–9G.

Subsequently, the processes for manufacturing an ordinary CMOS IC is advantageously used, namely, the polycrystalline silicon layer is oxidized, the insulation layer between other layers, PLTO is disposed, contact holes are formed, the aluminum electrode layer is disposed it is patterned, and the protective layer is formed, thereby implementing the MOSFET as shown in FIG. 6A.

If $BF_2^+$ions are used in place of B+ions for the B implantation, the ion implantation range $R_p$ is reduced to 1/4.5 of that of the B+ion implantation when the acceleration energy is the same due to the greater mass of the $BF_2^+$ion. Consequently, if $BF_2^+$ions are used for the B ion implantation, an implantation apparatus having a lower acceleration energy need not be utilized to implant B ions in the shallow portion, which advantageously enables to establish above-mentioned ion distribution.

According to the embodiment, in the n-channel transistor, the peak of the distribution of implanted ions is located in the proximity of the boundary between the gate oxide layer and the substrate, and hence the change of the ion implantation quantity $Q_{imp}$ *depends on the variation of the thickness $T_{ox}$* of the gate oxide layer; consequently, the influence of the change of $T_{ox}$ and that of the variation of $Q_{imp}$ *are cancelled by each other and the threshold voltage of the gate electrode is substantially fixed.*

In the p-channel transistor, the peak of the distribution of implanted ions is at a location in the substrate apart from the gate oxide layer, and hence the ion implantation quantity $Q_{imp}$ *does not greatly vary with the change of the thickness $T_{ox}$* of the gate oxide layer so as to keep the ion implantation quantity $Q_{imp}$ to be substantially constant; consequently, the gate threshold voltage is set to be substantially fixed excepting the change of the implantation dose caused by the ion implantation apparatus.

According to the present invention, therefore, the variation of the threshold voltage of the gate electrode can be prevented in the complementary insulated-gate field effect transistor IC.

The present invention may also be directed to a combination of the components of the embodiment of FIG. 1 and the components of the embodiment of FIG. 6A. Specifically, the complementary insulated-gate field effect transistor IC in which p-channel type and n-channel type insulated-gate FET's are formed may be configured in such a structure that the portion of the layer of the insulating material constituting the n-channel type transistor is thicker than the portion of the insulating material constituting the p-channel type transistor; the length in the channel direction of the portion of the layer of the insulating material constituting the p-channel type transistor exceeds the length in the channel direction of the portion of the layer of the insulating material constituting the n-channel type transistor; and the impurity ions for determining the threshold voltage Vt are implanted such that a peak of ion concentration is positioned in the vicinity of the boundary between the layer of the insulating material and the semiconductor substrate in the n-channel type transistor while another peak stays at locations in the semiconductor substrate apart from the layer of the insulating material in the p-channel type transistor.

Such an integrated circuit can be manufactured under the processes of FIGS. 2A–4B with the processes as shown in FIGS. 9C and 9D replaced for the process of FIG. 2F in which B+ions are implanted. Under the processes of FIGS. 9C and 9D, B+ions are respectively implanted in the regions of the p-channel and n-channel type transistors with predetermined acceleration energy and dose, thereby separately determining the threshold voltages of the p-channel and n-channel type transistors.

While the present invention has been described with reference to the particular illustrative embodiments, it is not restricted by those embodiments but only by the appended claims. It is to be appreciated that those skilled in the art can change or modify the embodiments without departing from the scope and spirit of the present invention.

What is claimed is:

1. A method of manufacturing a complementary insulated-gate field effect transistor integrated circuit comprising:
    a first step of forming a well of a first conductivity type on a primary surface of a silicon substrate;
    a second step of disposing an oxide layer on said primary surface and of disposing a nitride layer on said oxide layer;
    a third step of applying a mask to said nitride layer and of etching said nitride layer excepting a region to be used to form a transistor;
    a fourth step of respectively implanting ions in an area to be used to form a p-channel transistor and an area to be used to form an n-channel transistor, for forming field oxide isolation regions;
    a fifth step of applying a mask to the area to be used to form the p-channel transistor and of removing the nitride layer and the oxide layer on the region to be used to form the n-channel transistor through an etching;
    a sixth step of growing an oxide layer on the region to be used to form the n-channel transistor;
    a seventh step of applying a mask to the region to be used to form the n-channel transistor and of removing the nitride layer and the oxide layer on the region to be used to form the p-channel transistor through an etching;
    an eighth step of growing an oxide layer on the regions to be used to form the p-channel and n-channel transistors;
    a ninth step of depositing a polycrystalline silicon layer on said primary surface;
    a tenth step of applying a mask to a region of said polycrystalline silicon layer to be used to form the p-channel transistor, of implanting a first impurity substance in a region of said polycrystalline silicon layer not masked, and of activating the first impurity substance;
    an eleventh step of removing said mask and of implanting a second impurity substance in the whole polycrystalline silicon layer;
    a twelfth step of forming on a surface of said polycrystalline silicon layer a mask having substantially the same strip width in association with a gate electrode of the transistor;
    a thirteenth step of effecting a plasma etching to remove portions of said polycrystalline silicon layer not covered with said mask; and
    a fourteenth step of removing said mask, of diffusing a third impurity substance having a high diffusion constant in the region of said polycrystalline silicon layer to be used to form the p-channel transistor, and of diffusing a fourth impurity substance having a low diffusion constant in the region of said polycrystalline silicon layer to be used to form the n-channel transistor, thereby forming source and drain regions of the p-channel and n-channel transistors.

2. A method according to claim 1 wherein in said tenth step comprises the step of doping phosphorus as the first impurity substance in an atmosphere of $POCl_3$, the second impurity substance comprising a dopant selected from the group consisting of P and As.

3. A method according to claim 1 further including, between said eighth step and said ninth step, a fifteenth step of implanting impurity ions in the regions where the p-channel transistor and the n-channel transistor are respectively formed, thereby determining a gate threshold voltage.

4. A method according to claim 3 wherein said fifteenth step includes the steps of:
    implanting the impurity ions for the n-channel transistor so that an implanted range of the impurity ions is substantially equal to the thickness of the gate oxide film; and
    implanting the impurity ions in the p-channel transistor so that an implanted range of the impurity ions sufficiently exceeds the thickness of the gate oxide film.

* * * * *